United States Patent
Wang et al.

(10) Patent No.: US 8,990,756 B2
(45) Date of Patent: Mar. 24, 2015

(54) GATEWAY MODEL ROUTING WITH SLITS ON WIRES

(71) Applicant: Synopsys Taiwan Co., Ltd., Taipei (TW)

(72) Inventors: Hsin-Po Wang, Hsinchu (TW); Song Yuan, Xiamen (CN); Hung-Shih Wang, Hsinchu County (TW)

(73) Assignee: Synopsys Taiwan Co., Ltd., Taipei (TW)

( * ) Notice: Subject to any disclaimer, the term of this patent is extended or adjusted under 35 U.S.C. 154(b) by 0 days.

(21) Appl. No.: 14/086,158

(22) Filed: Nov. 21, 2013

(65) Prior Publication Data

US 2014/0143747 A1 May 22, 2014

Related U.S. Application Data

(60) Provisional application No. 61/729,343, filed on Nov. 22, 2012.

(51) Int. Cl.
  *G06F 17/50* (2006.01)

(52) U.S. Cl.
  CPC .................. *G06F 17/5077* (2013.01)
  USPC ............... 716/126; 716/129; 716/130

(58) Field of Classification Search
  USPC .......................... 716/126, 129–130
  See application file for complete search history.

(56) References Cited

U.S. PATENT DOCUMENTS

| | | | |
|---|---|---|---|
| 3,947,091 A * | 3/1976 | Trcka | 349/57 |
| 5,528,102 A * | 6/1996 | Gnade et al. | 313/496 |
| 6,542,216 B2 * | 4/2003 | von Gutfeld et al. | 349/153 |
| 8,413,098 B2 * | 4/2013 | Ding et al. | 716/126 |
| 8,667,444 B2 * | 3/2014 | Henrickson et al. | 716/122 |
| 2002/0089633 A1 * | 7/2002 | von Gutfeld et al. | 349/143 |
| 2003/0046647 A1 * | 3/2003 | Anazawa | 716/10 |
| 2003/0184706 A1 * | 10/2003 | Watson | 349/187 |
| 2004/0158805 A1 * | 8/2004 | Kanamoto et al. | 716/11 |
| 2005/0071797 A1 * | 3/2005 | Fujii | 716/12 |
| 2005/0226574 A1 * | 10/2005 | Walker et al. | 385/120 |
| 2005/0235869 A1 * | 10/2005 | Cruchon-Dupeyrat et al. | 106/31.29 |
| 2009/0255572 A1 * | 10/2009 | Oswald | 136/251 |
| 2010/0058273 A1 * | 3/2010 | Katagiri | 716/12 |
| 2010/0077373 A1 * | 3/2010 | Isomura | 716/12 |
| 2010/0100863 A1 * | 4/2010 | Nakano | 716/14 |
| 2011/0093829 A1 * | 4/2011 | Orita et al. | 716/129 |
| 2011/0134352 A1 * | 6/2011 | Nakagawa | 349/43 |
| 2011/0219347 A1 * | 9/2011 | Fukunaga et al. | 716/129 |
| 2012/0257132 A1 * | 10/2012 | Kitajima et al. | 349/42 |
| 2013/0033667 A1 * | 2/2013 | Yanagisawa et al. | 349/139 |

* cited by examiner

*Primary Examiner* — Stacy Whitmore
(74) *Attorney, Agent, or Firm* — Kilpatrick Townsend & Stockton LLP

(57) ABSTRACT

A computer-implemented method for routing at least one conductor includes generating the at least one conductor within a bounded region on a planar surface in accordance with a template, and placing at least one slit in the conductor when the conductor overlaps a specified region of the bounded region in accordance with a specified pattern.

48 Claims, 8 Drawing Sheets

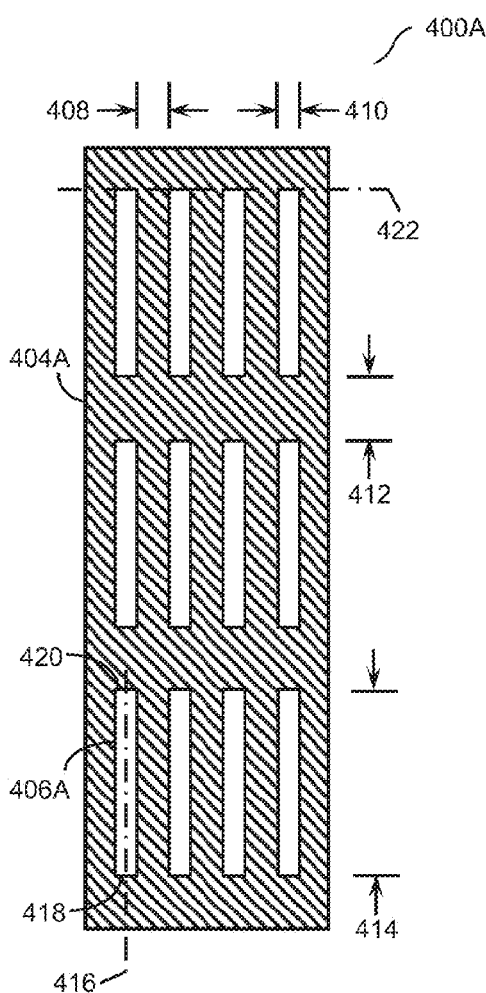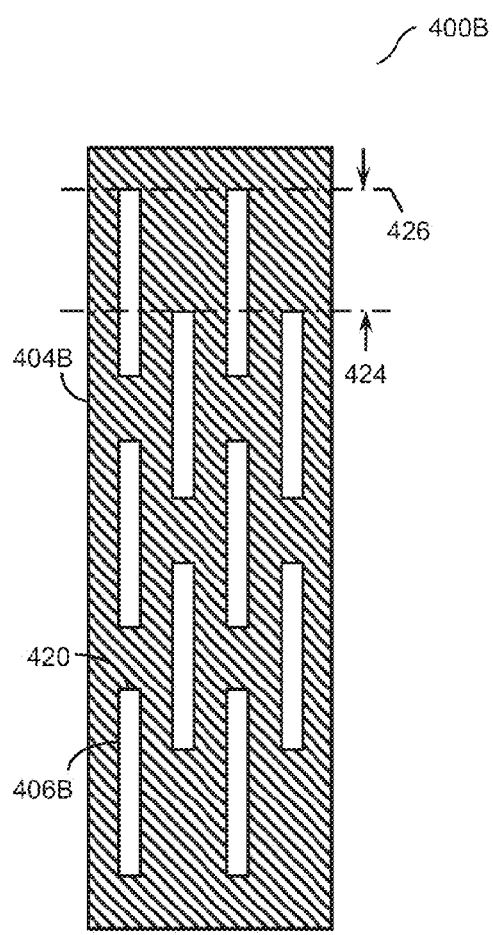
FIG. 4A
FIG. 4B

FIG. 9A                    FIG. 9B

GATEWAY MODEL ROUTING WITH SLITS ON WIRES

CROSS-REFERENCES TO RELATED APPLICATIONS

The present application claims benefit under 35 USC 119 (e) of U.S. Provisional Application No. 61/729,343, filed Nov. 22, 2012, entitled "Gateway Model Routing With Slits On Wires", the content of which is incorporated herein by reference in its entirety. The present application is related to commonly assigned U.S. Pat. No. 7,779,379, entitled "Template-Based Gateway Model Routing System", filed Jun. 11, 2007, the content of which is incorporated herein by reference in its entirety.

BACKGROUND

The present invention relates generally to a method and system for computer aided design (CAD) of electrical conductors routed on planar surfaces and in particular to routing electrical conductors with slits.

Flat panel displays (FPD) may include two glass plates that are glued together but separated by a narrow gap. Seals are used to glue the glass plates and contain the liquid crystal material used with the FPD. During FPD manufacture, adhesive is applied to the seals and cured by ultra-violet (UV) light. Thin films of conductors, hereinafter also referred to as "wires", serving to carry electrical signals may be manufactured on the glass plates but may block some of the UV light needed to cure the adhesive adjoining the conductors. Narrow stripes, hereinafter also referred to as "slits", represent conductor that is removed wherever conductor traces overlap seal regions so that the UV light may go through the slits and cure the adhesive during manufacture. It is understood that removing narrow stripes of conductor from a wire is the same as adding slits to the wire.

Computer aided design (CAD) tools called routers are used to automatically generate digital patterns corresponding to wire routes on planar surfaces. One such CAD technique is described in U.S. Pat. No. 7,779,379, entitled "Template-Based Gateway Model Routing System", which describes an automated way to route wires within a corridor region according to a routing template. The routing template includes saved data that is associated with user specified constraints such as the shape and location of the corridor region, and wire routing constraints such as the locations of wire terminal edges, the width, spacing, alignment, resistance, and other attributes of the conductors. However, existing CAD routers do not automatically handle slit placement. Therefore designers initially ignore slits, run the CAD router, and then add slits manually. If there is no routing constraint involving resistance values of the wire, the manual addition of slits may be acceptable. However, because slits change the resistance of a wire compared to the same wire without slits, the design goals may be compromised. Then, the designer may need to calculate the resistance value for the wires with slits. Often, the resistance value with slits is unacceptably high and the designer then needs to adjust wire widths, re-do slit placement, and recalculate the wire resistances, which takes a long time. Therefore, a CAD routing tool that automatically routes wires and places slits to meet design constraints would be desired to reduce design time.

BRIEF SUMMARY OF THE INVENTION

According to one embodiment of the present invention, a computer-implemented method for routing at least one conductor includes generating, using one or more computer systems, the at least one conductor within a bounded region on a planar surface in accordance with a template. The computer-implemented method further includes placing, using the one or more computer systems, at least one slit in the conductor when the conductor overlaps a specified region in the bounded region in accordance with a specified pattern.

According to one embodiment, placing the at least one slit includes aligning, using the one or more computer systems, a longitudinal axis of the at least one slit in a direction substantially parallel to a centerline of the at least one conductor. According to one embodiment, the specified region is associated with a seal region of a flat panel display.

According to one embodiment, the method further includes adapting, using the one or more computer systems, the at least one slit to allow a quantity of light to go through the at least one slit when curing an adhesive in the specified region using the quantity of light. According to one embodiment, the specified pattern determines a characteristic of the at least one slit includes at least one of a width, or a length.

According to one embodiment, the at least one slit includes a first slit. The method further includes placing, using the one or more computer systems, a second slit in the conductor when the conductor overlaps the specified region of the bounded region in accordance with the specified pattern. The specified pattern determines at least one of a spacing between the first and second slits, or an alignment between the first and second slits.

According to one embodiment, the template includes a multitude of bounded region values specifying a shape of the bounded region bounded by a multitude of terminal edges and at least one boundary edge. The template further includes a multitude of routing constraint values specifying constraints on routing the at least one conductor through the bounded region. The at least one conductor is routed between the multitude of terminal edges.

According to one embodiment, the method further includes calculating, using the one or more computer systems, an estimated resistance of the at least one conductor. According to one embodiment, calculating the estimated resistance includes using an electromagnetic field solver.

According to one embodiment, calculating the estimated resistance includes dividing, using the one or more computer systems, the at least one conductor into a first section and a second section different from the first section, the second section including at least a greater portion of the at least one slit. Calculating the estimated resistance further includes calculating, using the one or more computer systems, a first resistance of the first section and a second resistance of the second section, the first and second resistances being calculated without an effect on the first and second resistances by the at least one slit. Calculating the estimated resistance further includes calculating, using the one or more computer systems, a first area of the second section by including in the first area an area occupied by the greater portion of the at least one slit. Calculating the estimated resistance further includes calculating, using the one or more computer systems, a second area of the greater portion of the at least one slit. Calculating the estimated resistance further includes calculating, using the one or more computer systems, a third resistance of the second section by multiplying the second resistance by a ratio of the first area divided by the difference of the first area minus the second area. Calculating the estimated resistance further includes determining, using the one or more computer systems, the estimated resistance of the at least one conductor by adding the first resistance to the third resistance.

According to one embodiment, generating, placing, and calculating an estimated resistance are repeated until satisfying a resistance constraint for the at least one conductor specified in the template. According to one embodiment, dividing the at least one conductor includes cutting, using the one or more computer systems, the at least one conductor such that the second section includes the at least one slit. According to one embodiment, calculating a first or second resistance includes using a shortest path method.

According to one embodiment of the present invention, a system for routing at least one conductor includes a processor and a memory storing a set of instructions which when executed by the processor configures the processor to generate the at least one conductor within a bounded region on a planar surface in accordance with a template. The set of instructions further configures the processor to place at least one slit in the conductor when the conductor overlaps a specified region in the bounded region in accordance with a specified pattern.

According to one embodiment, the set of instructions that configures the processor to place the at least one slit includes instructions that configures the processor to align a longitudinal axis of the at least one slit in a direction substantially parallel to a centerline of the at least one conductor. According to one embodiment, the set of instructions further configures the processor to adapt the at least one slit to allow a quantity of light to go through the at least one slit when curing an adhesive in the specified region using the quantity of light.

According to one embodiment, the at least one slit includes a first slit. The set of instructions further configures the processor to place a second slit in the conductor when the conductor overlaps the specified region of the bounded region in accordance with the specified pattern. The specified pattern determines at least one of a spacing between the first and second slits, or an alignment between the first and second slits.

According to one embodiment, the set of instructions further configures the processor to calculate an estimated resistance of the at least one conductor. According to one embodiment, the set of instructions further configures the processor to calculate the estimated resistance by using an electromagnetic field solver.

According to one embodiment, the set of instructions further configures the processor to divide the at least one conductor into a first section and a second section different from the first section, the second section including at least a greater portion of the at least one slit. The set of instructions further configures the processor to calculate a first resistance of the first section and a second resistance of the second section, the first and second resistances being calculated without an effect on the first and second resistances by the at least one slit. The set of instructions further configures the processor to calculate a first area of the second section by including in the first area an area occupied by the greater portion of the at least one slit and to calculate a second area of the greater portion of the at least one slit. The set of instructions further configures the processor to calculate a third resistance of the second section by multiplying the second resistance by a ratio of the first area divided by the difference of the first area minus the second area. The set of instructions further configures the processor to determine the estimated resistance of the at least one conductor by adding the first resistance to the third resistance.

According to one embodiment, the set of instructions further configures the processor to generate, place, and calculate an estimated resistance repeatedly until satisfying a resistance constraint for the at least one conductor specified in the template. According to one embodiment, the set of instructions further configures the processor to divide the at least one conductor such that the second section includes the at least one slit. According to one embodiment, the set of instructions further configures the processor to calculate a first or second resistance using a shortest path method.

According to one embodiment of the present invention, a non-transitory computer-readable medium storing computer-executable code for routing at least one conductor includes code for generating the at least one conductor within a bounded region on a planar surface in accordance with a template. The non-transitory computer-readable medium further includes code for placing at least one slit in the conductor when the conductor overlaps a specified region in the bounded region in accordance with a specified pattern.

According to one embodiment, code for placing the at least one slit includes code for aligning a longitudinal axis of the at least one slit in a direction substantially parallel to a centerline of the at least one conductor. According to one embodiment, the non-transitory computer-readable medium further includes code for adapting the at least one slit to allow a quantity of light to go through the at least one slit when curing an adhesive in the specified region using the quantity of light. According to one embodiment, the specified pattern determines a characteristic of the at least one slit includes at least one of a width, or a length.

According to one embodiment, the at least one slit includes a first slit, the non-transitory computer-readable medium further includes code for placing a second slit in the conductor when the conductor overlaps the specified region of the bounded region in accordance with the specified pattern. The specified pattern determines at least one of a spacing between the first and second slits, or an alignment between the first and second slits.

According to one embodiment, the non-transitory computer-readable medium further includes code for calculating an estimated resistance of the at least one conductor. According to one embodiment, code for calculating the estimated resistance includes code for using an electromagnetic field solver.

According to one embodiment, code for calculating the estimated resistance includes code for dividing the at least one conductor into a first section and a second section different from the first section, the second section including at least a greater portion of the at least one slit. Code for calculating the estimated resistance further includes code for calculating a first resistance of the first section and a second resistance of the second section, the first and second resistances being calculated without an effect on the first and second resistances by the at least one slit. Code for calculating the estimated resistance further includes code for calculating a first area of the second section by including in the first area an area occupied by the greater portion of the at least one slit and code for calculating a second area of the greater portion of the at least one slit. Code for calculating the estimated resistance further includes code for calculating a third resistance of the second section by multiplying the second resistance by a ratio of the first area divided by the difference of the first area minus the second area. Code for calculating the estimated resistance further includes code for determining the estimated resistance of the at least one conductor by adding the first resistance to the third resistance.

According to one embodiment, code for generating, code for placing, and code for calculating an estimated resistance are repeated until satisfying a resistance constraint for the at least one conductor specified in the template. According to one embodiment, code for dividing the at least one conductor includes code for cutting the at least one conductor such that the second section includes the at least one slit. According to one embodiment, code for calculating a first or second resistance includes code for using a shortest path method.

BRIEF DESCRIPTION OF THE DRAWINGS

FIG. 4A depicts a simplified plan view of a conductor including a multitude of characteristics determined by a specified pattern for a multitude of slits with aligned ends, in accordance with one embodiment of the present invention.

FIG. 4B depicts a simplified plan view of a conductor including a multitude of slits including alternating aligned ends, in accordance with one embodiment of the present invention.

DETAILED DESCRIPTION

Figure 1:
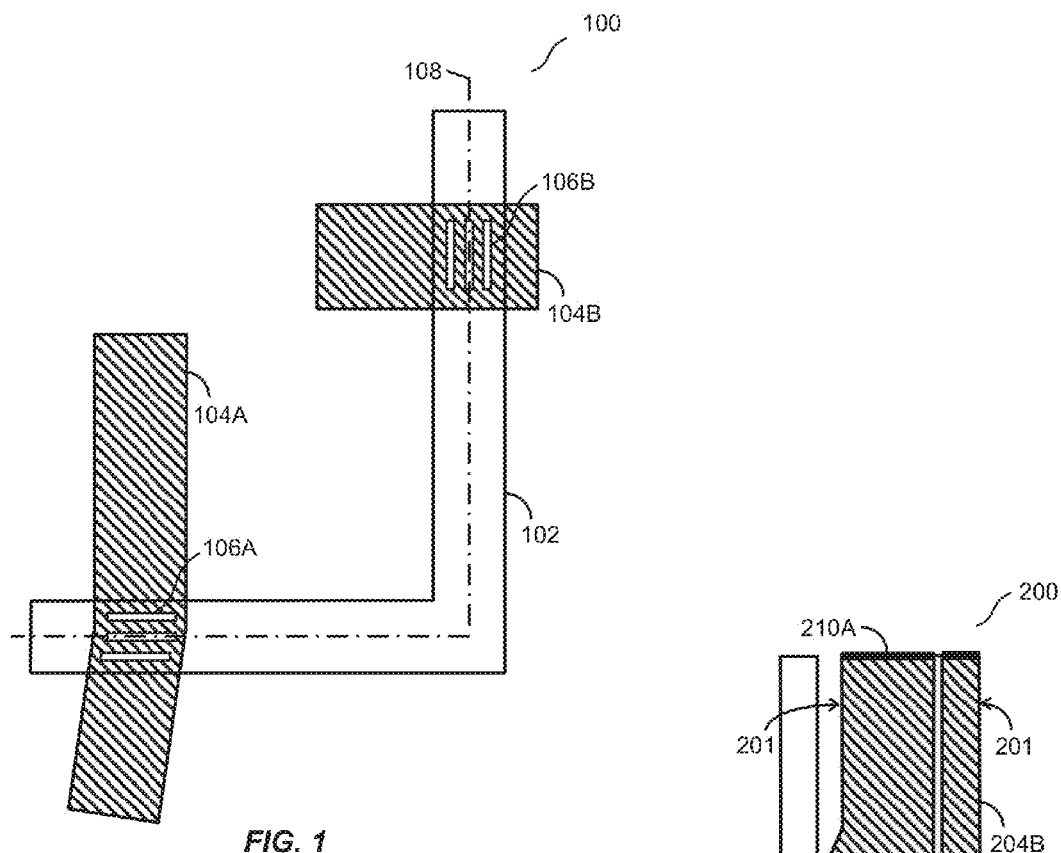
FIG. 1 depicts a simplified plan view of a multitude of wires including a multitude of slits where the multitude of wires overlaps a specified seal region, in accordance with one embodiment of the present invention.

FIG. 1 depicts a simplified plan view 100 of a multitude of wires 104A, 104B including a multitude of slits 106A, 106B respectively, where the multitude of wires overlaps a specified seal region 102, in accordance with one embodiment of the present invention. Specified seal region 102 may be data associated with a portion of a seal in a FPD that may be specified as data in a FPD layout database, or the layout database for any other planar structure. The layout database may be received as an input by the CAD system for routing conductors, hereinafter also referred to as "CAD system", using embodiments of the present invention to automatically route or generate multitude of wires 104A, 104B and place multitude of slits 106A, 106B in user desired locations. The location and alignment of the multitude of slits 106A, 106B and multitude of wires 104A, 104B may be specified by the user via a template data file, hereinafter also referred to as "template".

In one embodiment, the characteristics of each of the multitude of slits 106A, 106B may be adapted to allow a quantity of UV light to go through the slits when curing an adhesive in the specified seal region using the UV light during FPD manufacturing. In one embodiment, each of the multitude of slits 106A, 106B includes a longitudinal axis. In the depicted embodiment, the longitudinal axes of the multitude of slits 106A may be aligned substantially parallel to a centerline 108 of specified seal region 102. However, other slit alignments may be specified in the template as described below.

Figure 2:
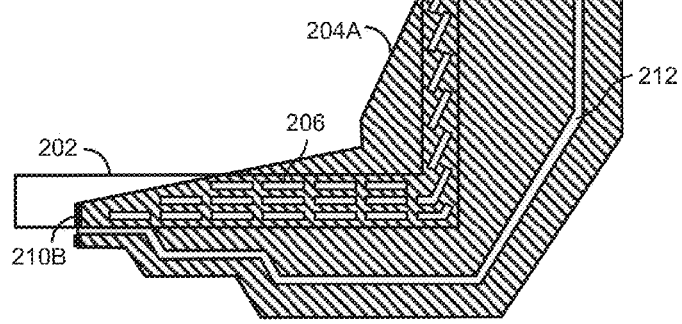
FIG. 2 depicts a simplified plan view of a bounded region including a multitude of wires including a multitude of slits where the wires overlap a specified seal region, in accordance with one embodiment of the present invention.

FIG. 2 depicts a simplified plan view 200 of a bounded region 201 including a multitude of wires 204A, 204B including a multitude of slits 206 where the wires overlap a specified seal region 202, in accordance with one embodiment of the present invention. Bounded region 201, depicted with light grey shading, may be a routing corridor whose location on the FPD may be specified in the template. The template may include a multitude of bounded region values specifying a shape of bounded region 201 bounded by a multitude of terminal edges 210A, 210B depicted by thick lines, and at least one boundary edge. The template may further include a multitude of routing constraint values specifying constraints on routing conductor 204 through bounded region 201 and between the multitude of terminal edges 210A, 210B.

The template may further include user specified gateways, attributes, and routing constraints. Routing constraint values may include wire width, spacing, alignment, uniform resistance, and the like, which may be collectively saved in the template. The system may input a template and automatically generate wires within the corridor or bounded region to satisfy the descriptions and constraints associated with the template. Further details of a router system called "gateway model routing" (GMR) may be found in U.S. Pat. No. 7,779,379, referenced above. The embodiments of the present invention may be added to such an existing GMR system, or other router systems, to enable automatic slit placement.

The shape of bounded region 201 may be complex to route the wires around blockages such as other circuit components on the FPD. Multitude of wires 204A, 204B may be routed automatically by the CAD system according to attributes specified in the template including, in this example, routing multitude of wires 204A, 204B such that the width of multitude of wires 204A, 204B fills bounded region 201 with the exception of a wire-to-wire spacing 212. Filling bounded region 201 with wire reduces a resistance value in wire 204A. However, because wire 204A overlaps specified seal region 202, the requisite placement of the multitude of slits 206 may increase the resistance value of wire 204A. The CAD system may calculate an estimated resistance of wire 204A with slit placement and adjust the width of wire 204A during routing to meet the desired resistance design goal automatically, thus saving engineering time and cost. Although this example provides just one wire receiving slits, it is understood that the CAD system may automatically generate slits in any number of wires that overlap the seal region according to the template specifications.

Figure 3:
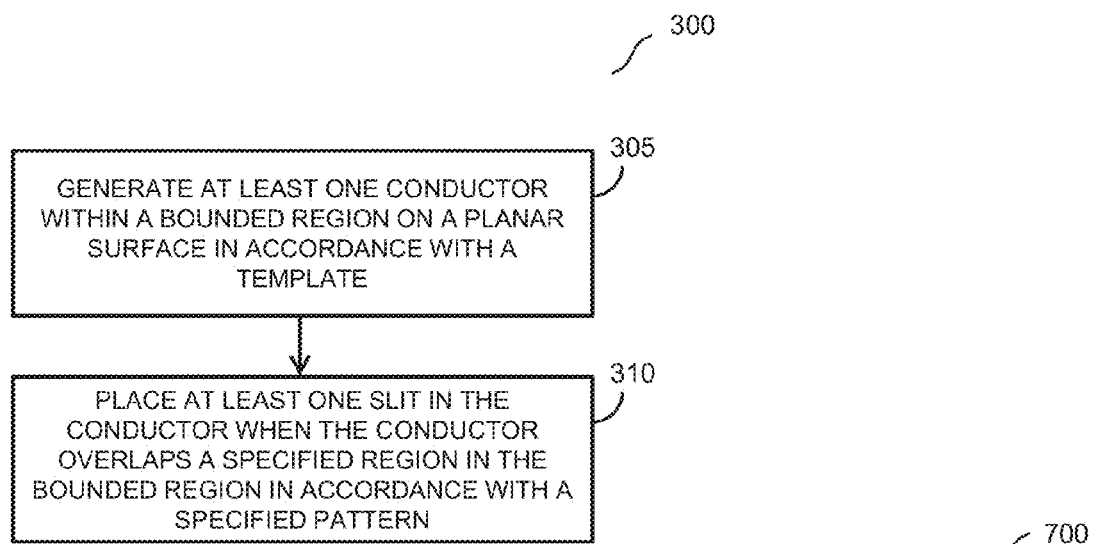
FIG. 3 depicts a first simplified flow chart for routing at least one conductor, in accordance with one embodiment of the present invention.

FIG. 3 depicts a first simplified flow chart 300 for routing at least one conductor, in accordance with one embodiment of the present invention. First simplified flow chart 300 includes the following steps. Referring simultaneously to FIG. 2 and FIG. 3, using one or more computer systems, at least one conductor 204A may be generated 305 within bounded region 208 on a planar surface in accordance with the template. The CAD system places 310 at least one slit in conductor 204A when the conductor overlaps specified seal region 202 in bounded region 208 in accordance with a specified pattern.

FIG. 4A depicts a simplified plan view 400A of a conductor 404A including a multitude of characteristics determined by a specified pattern for a multitude of slits 406A with aligned ends, in accordance with one embodiment of the present invention. The specified pattern determines slit characteristics that may include a longitudinal side by longitudinal side slit spacing 408, a slit width 410, an end-to-end slit spacing 412, and a slit length 414. Each of the multitude of slits 406A includes a longitudinal axis 416, which intersects two ends 418, 420 of each of the multitude of slits 406A.

In one embodiment, the slit characteristics may further include an alignment characteristic such that end 420 of each of multitude of slits 406A is substantially aligned to a line 422. FIG. 4B depicts a simplified plan view 400B of a conductor 404B including a multitude of slits 406B including alternating aligned ends, in accordance with one embodiment of the present invention. In this embodiment, the slit characteristics may further include an alignment characteristic such that end 420 of adjacent columns of multitude of slits 406B is spaced apart by a distance 424, which results in alternating columns of the multitude of slits 406B including ends aligned to a line 426. A column may be defined in the longitudinal direction of the multitude of slits 406B.

Figure 5:
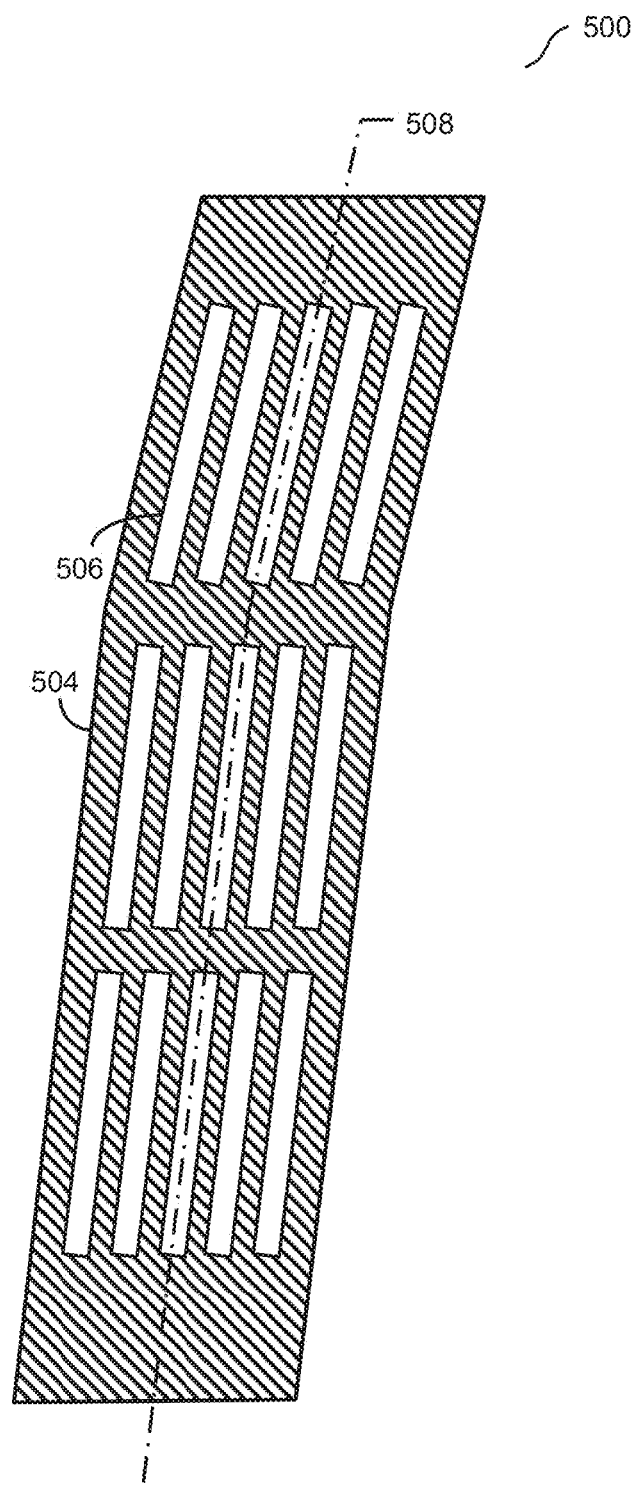
FIG. 5 depicts a simplified plan view of a conductor including a multitude of slits aligned with a centerline of the conductor, in accordance with one embodiment of the present invention.

FIG. 5 depicts a simplified plan view 500 of a conductor 504 including a multitude of slits 506 aligned with a centerline 508 of the conductor, in accordance with one embodiment of the present invention. Each of the multitude of slits 506 may be aligned such that the longitudinal axis of each of the multitude of slits 506 is in a direction substantially parallel to a centerline 508 of the at least one conductor 504. It is noted that unlike channel based routing used for many integrated circuit designs, conductor routing for FPD may not be constrained along orthogonal axes, but may instead support complex shapes and angles for conductors as depicted in FIG. 5. Thus the way multitude of slits 506 are automatically placed in the at least one conductor by the CAD system may be defined by the multitude of slit characteristics as determined by or according to a specified pattern, which in turn may be specified by the user.

Figure 6:
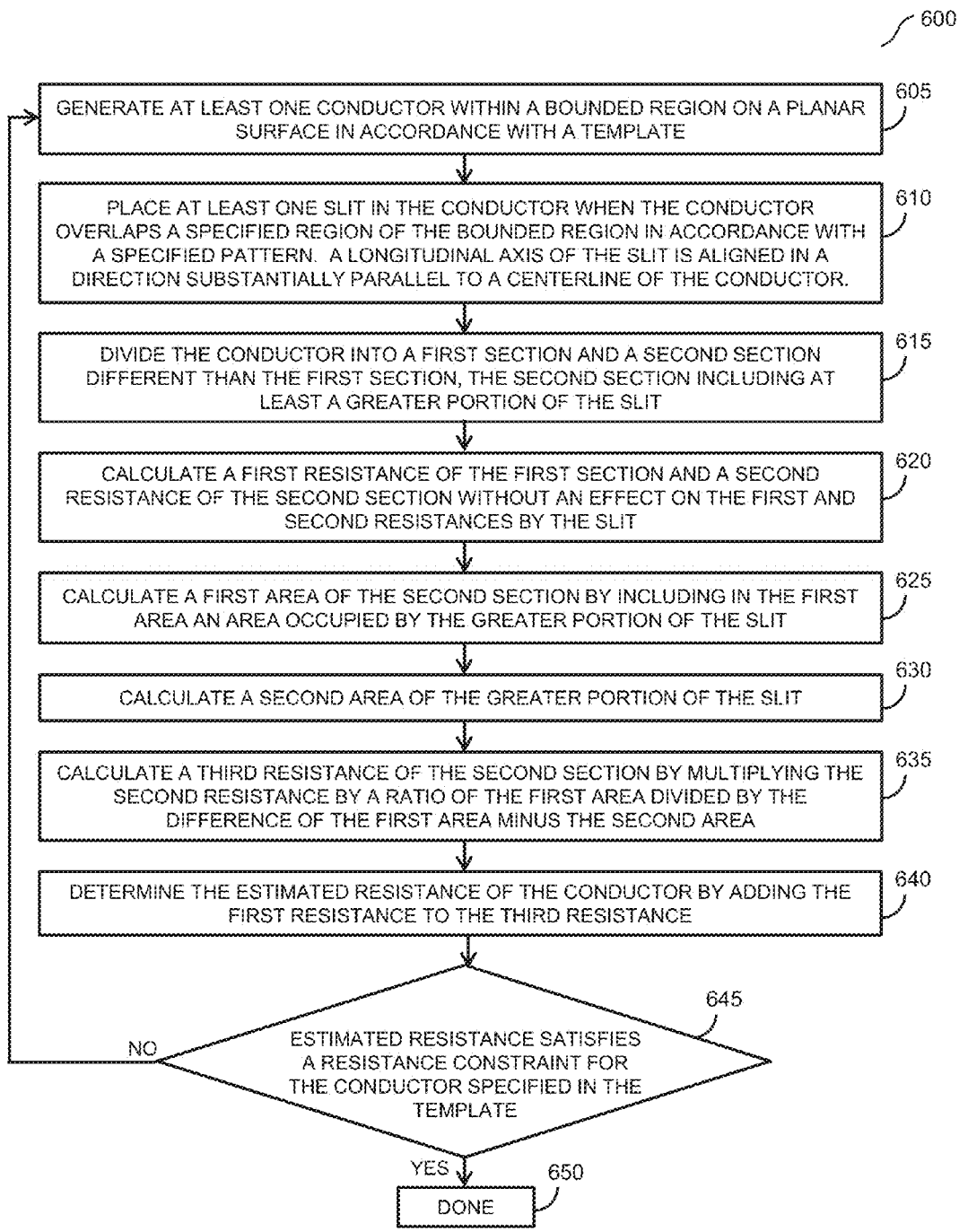
FIG. 6 depicts a second simplified flow chart for routing at least one conductor, in accordance with one embodiment of the present invention.

FIG. 6 depicts a second simplified flow chart 600 for routing at least one conductor, in accordance with one embodiment of the present invention. Steps 605 and 610 have similar features to steps 305 and 310 depicted in FIG. 3 except for the following. Referring simultaneously to FIG. 2, FIG. 4A, FIG. 5, and FIG. 6, using one or more computer systems, longitudinal axis 416 of at least one slit of multitude of slits 206, 406A, 506 may be aligned 610 in a direction substantially parallel to a centerline 508 of at least one conductor 204A, 404A, 504, respectively.

Next, the CAD system may calculate an estimated resistance of wire 204A, 404A, 504 with the at least one slit or multitude of slits emplaced in the wire. In one embodiment, a precise estimate for the resistance of wire 204A, 404A, 504 may be calculated by the CAD system using a commercially available electromagnetic field solver based on the geometry of the wire including the slit positions. However, the computation time using field solvers may be slow. An embodiment that provides faster computation time than using an electromagnetic field solver to estimate the wire resistance with slits and is compatible with existing GMR systems is described below.

Manufacturers or foundries using planar manufacturing techniques to fabricate wires on planar surfaces may routinely measure the resistance value r per unit area of metal. Then, the resistance value R of a rectangular shaped metal of dimensions (W*L) is given by:

$$R = r*(L/W) \quad \text{(eq. 1)}.$$

In other words the total R of the wire is proportional to the length of the wire, which is defined in the direction of current flow in the wire, and inverse proportional to the width of the wire.

Figure 7:
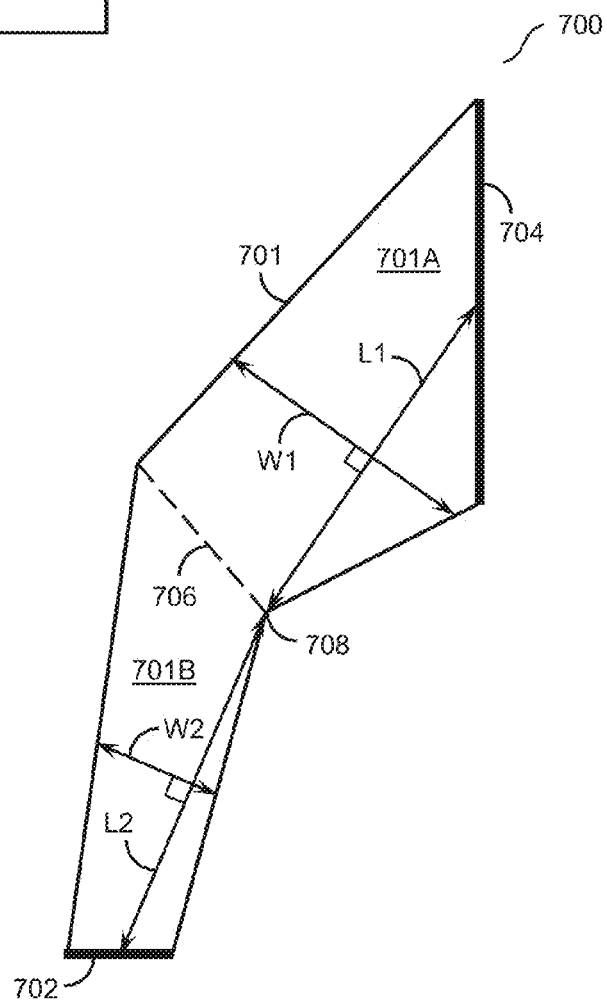
FIG. 7 depicts a simplified plan view of a wire including a multitude of parameters for a first shortest path technique to estimate the resistance of the wire, in accordance with one embodiment of the present invention.

FIG. 7 depicts a simplified plan view 700 of a wire 701 including a multitude of parameters for a first shortest path technique to estimate the resistance of wire 701, in accordance with one embodiment of the present invention. Wire 701 may include at least one or a multitude of tiles 701A, 701B divided by a gateway 706 depicted by the dashed line, and a multitude of terminal edges 702, 704 depicted by thick lines. The gateway and terminal edges may be defined in the template. Wire 701 may include a non-rectangular shape whose estimated resistance, $R_{WIRE}$, may be calculated as follows. First, the shortest path from the begin edge to the end edge of the shortest path in a tile is determined and is the length (L) for calculating the value of R. Then, a perpendicular line segment is drawn at the middle of the shortest path. The length of the perpendicular line segment that intersects the tile is the width (W) for calculating the value of R. Finally, equation 1 above is used for each tile of the conductor and the value of R for each tile is summed to arrive at the total $R_{WIRE}$. A shortest path L1 in a tile 701A may be defined between the center of a terminal edge 704 and an intersection between gateway 706 and a corner 708 of tile 701A closest to terminal edge 702. A shortest path L2 in a tile 701B may be defined between the center of a terminal edge 702 and an intersection between gateway 706 and a corner 708 of tile 701B closest to terminal edge 704. A width W1 may be defined by the perpendicular bisector of L1 enclosed within the area of tile 701A. A width W2 may be defined by the perpendicular bisector of L2 enclosed within the area of tile 701B. Then the estimated resistance value $R_{WIRE}$ of wire 701 may be given by:

$$R_{WIRE} = r*(L1/W1) + r*(L2/W2).$$

Similarly, the resistance of a wire with more tiles would be the sum of the individual tile resistances.

Figure 8:
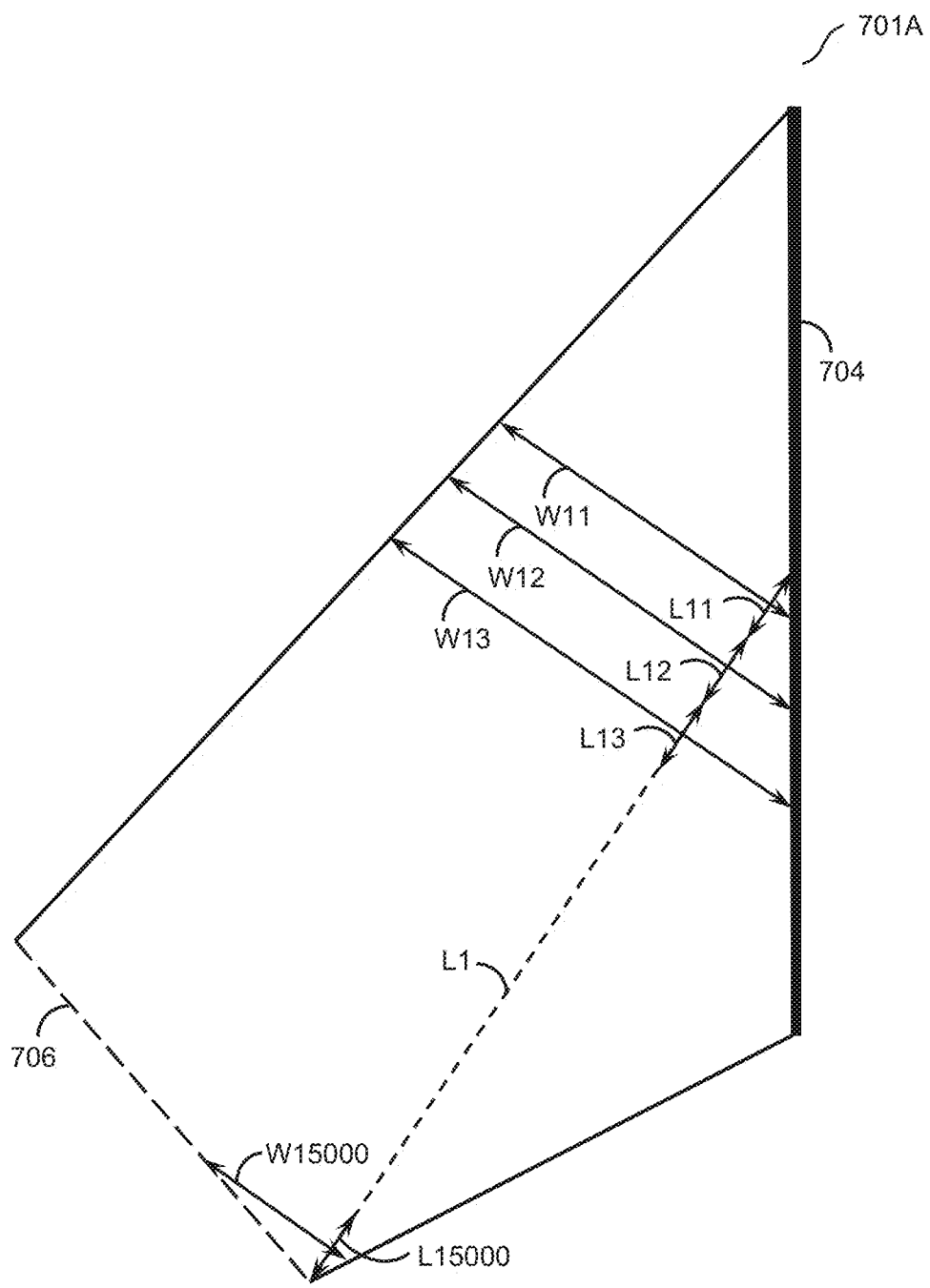
FIG. 8 depicts a simplified plan view of a portion of FIG. 7 including a multitude of parameters for a second shortest path technique, in accordance with one embodiment of the present invention.

FIG. 8 depicts a simplified plan view of a portion of FIG. 7, tile 701A, including a multitude of parameters for a second shortest path technique, in accordance with one embodiment of the present invention. The second shortest path technique may give more accurate results than the first shortest path technique depicted in FIG. 7. Referring to FIG. 8, L1 may be divided into a predefined large number of sections, such as 5000 sections, including a multitude of L1 parts L11, L12, L13 through L15000. A width W1x may be defined by the perpendicular bisector of each L1x enclosed within the boundary or area of tile 701A, resulting in a multitude of perpendicular bisector widths W11, W12, W13 through W15000 associated with each different corresponding L1x. Then the estimated resistance value for tile 701A along shortest path L1, $R_{L1}$ may be given by:

$$R_{L1} = r*(L11/W11) + r*(L12/W12) + r*(L13/W13) + \ldots + r*(L15000/W15000).$$

The resistance of tile 701B depicted in FIG. 7, $R_{L2}$, may be calculated analogously as $R_{L1}$ and the resistance of a wire with more tiles would be the sum of the individual tile resistances using the second shortest path technique, i.e.:

$$R_{WIRE} = R_{L1} + R_{L2}.$$

The first or second shortest path techniques work well for wires without slits; however, adding a multitude of slits to the conductor may change the resistance significantly adding error to the estimated resistance value. The following resistance estimation technique, called the area ratio technique, accurately models the effect of adding slits to a wire without substantially increasing computation time.

Figure 9:
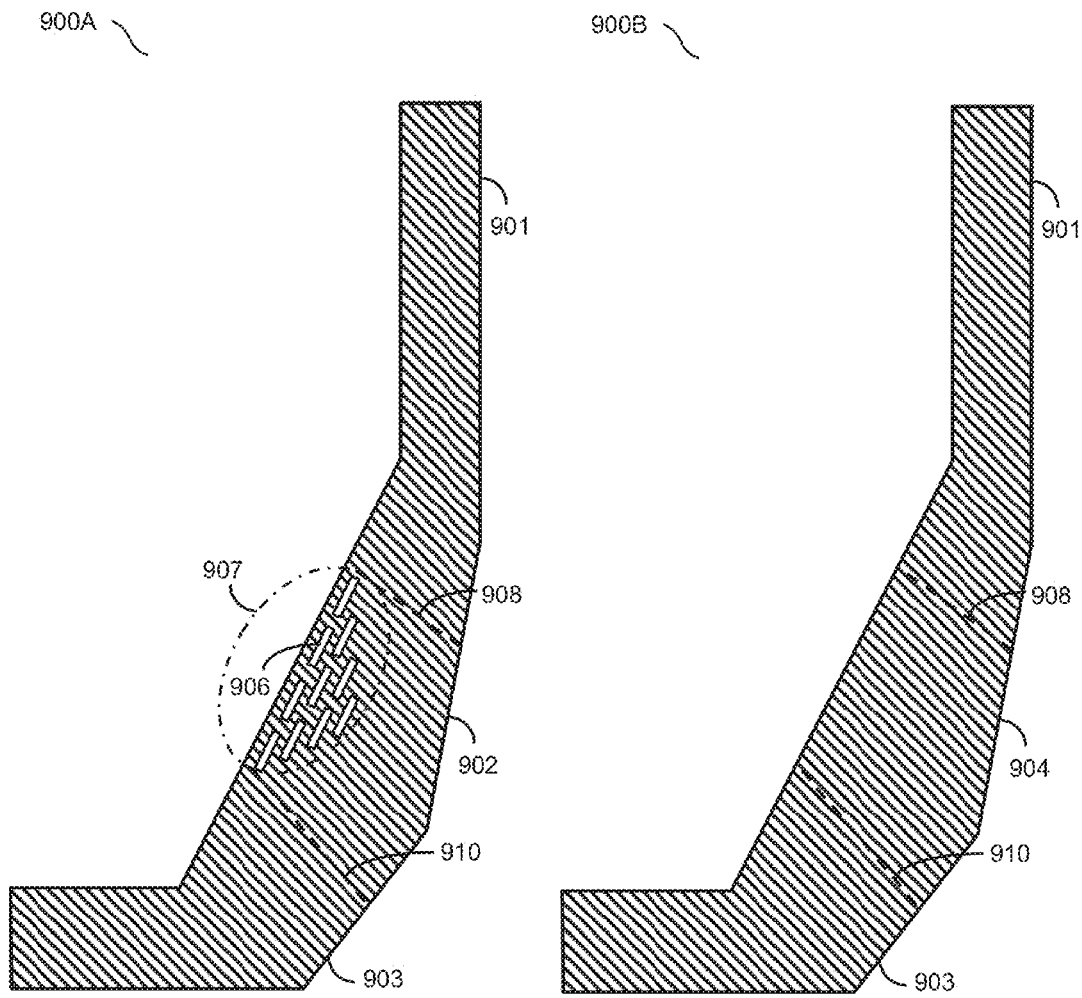
FIG. 9A depicts a simplified plan view of a conductor divided into a multitude of sections including a section with a multitude of slits, in accordance with one embodiment of the present invention.
FIG. 9B depicts a simplified plan view of the conductor depicted in FIG. 9A not including the multitude of slits, in accordance with one embodiment of the present invention.

FIG. 9A depicts a simplified plan view of a conductor 900A divided into a multitude of sections 901, 902, 903 including a section 902 with a multitude of slits 906, in accordance with one embodiment of the present invention. In accordance with the area ratio technique, the CAD system may divide the wire into a multitude of sections including at least one section that includes at least a greater portion of at least one slit. The CAD system may divide the wire into two kinds of sections—a first kind of section where slits were not placed, and a second kind of section that includes slits. There may be any number of sections of either kind in any combination depending on the template data.

The multitude of slits 906 may form a group of slits 907. Conductor 900A includes a multitude of cut lines 908, 910 placed at the borders of group of slits 907. Cut lines 908, 910 respectively determine the borders between section 901, section 902 and section 902, section 903. The locations of multitude of cut lines 908, 910 may be determined using a similar technique as forming a perpendicular bisector of the shortest path within the conductor. The multitude of cut lines 908, 910 may be positioned along the shortest path such that the group of slits 907 is included substantially within section 902 and sections 901, 903 may exclude multitude of slits 906. The accuracy of the area ratio technique may not be significantly reduced if multitude of cut lines 908, 910 happen to cut through a small portion of one or more of the multitude of slits 906 so long as the greater portion of the multitude of slits is still included within section 902. However, positioning each cut line such that the cut line is at an edge of a group of slits may improve accuracy of the resistance estimates.

FIG. 9B depicts a simplified plan view of the conductor depicted in FIG. 9A not including multitude of slits 906, i.e. conductor 900B, in accordance with one embodiment of the present invention. In other words, conductor 900B is the same as conductor 900A except that section 902 is replaced by a section 904 without slits. The area of section 902 that was reduced by the multitude of slits 906 in FIG. 9A may be "filled in" or replaced by additional conductor area in section 904 as if the slits were removed from section 902, while the outside borders and cut lines 908, 910 of section 902 remain unchanged in conductor 900B.

Referring simultaneously to FIG. 6, FIG. 9A, and FIG. 9B, according to the area ratio technique to calculate an estimated resistance, the following steps may be performed in one embodiment. The CAD system divides 615 the at least one conductor 900A into a section 901 and a section 902 different than the section 901. Section 902 includes at least a greater portion of the at least one slit of the multitude of slits 906. The CAD system divides the wire into as many sections as needed based on how slits are disposed in the wire.

The CAD system calculates 620 a first resistance of section 901, $R_{901}$, and a second resistance of section 902, $R_{902}$. The first and second resistances may be calculated without an effect on the first and second resistances by the at least one slit. Conventional techniques, such as the shortest path technique, may be used to estimate the resistance for those sections without slits or without the substantial portion of the at least one slit, such as sections 901, 903 to provide $R_{901}$, $R_{903}$, respectively. For section 902 or any section including the substantial portion of the at least one slit, the CAD system also calculates a second resistance for section 902, $R_{904}$, based on section 904, where the multitude of slits 906 in section 902 have been filled in with conductor. The CAD system may then calculate $R_{904}$ using conventional techniques, such as the shortest path technique.

The CAD system calculates 625, a first area of the section 902 by including in the first area an area occupied by the greater portion of the at least one slit. In other words, the CAD system calculates an area for section 904 and calls it a first area, A. The CAD system calculates 630, a second area, $A_{SLITS}$, of the greater portion of the at least one slit or a total area of the multitude of slits 906 in section 902. Next, the CAD system calculates 635, a third resistance of section 902, $R_{902}$, by multiplying the second resistance by a ratio of the first area divided by the difference of the first area minus the second area. In other words the estimated resistance of section 902, $R_{902}$, is given by:

$$R_{902} = r_{904} * A/(A - a_{SLITS}).$$

Next, the CAD system determines 640 the estimated resistance of the at least one conductor 900A, $R_{900A}$, by calculating the sum of the resistances of all the sections of conductor 900A by adding the first resistance, $R_{901}$ and the analogously calculated $R_{903}$, to the third resistance, $R_{902}$. In other words, $R_{900A}$ is given by:

$$R_{900A} = R_{901} + R_{902} + R_{903}.$$

The CAD system may iteratively repeat steps 605 through 640 until satisfying 645 a resistance constraint for the at least one conductor 900A specified in the template. The technique is done 650 once the estimated resistance satisfies the resistance constraint for the conductor specified in the template.

Better accuracy may be obtained using the area ratio technique when the longitudinal axes of the slits are placed substantially in parallel with the centerlines of wires. In the GMR technique, the direction of a wire's centerline is a good indication of the direction of electric current flow through that section of wire. When the long and skinny slits are placed along the direction of wire centerline, the area ratio technique can estimate the resistance of that section with accuracy. Experiments show that the result obtained using the area ratio technique is within 5 to 10% of the result obtained with electromagnetic field solvers. However, the speed of area ratio technique is more than 10 times faster than using electromagnetic field solvers. Therefore, area ratio technique is well suited for enhanced GMR that supports slits on wires.

Figure 10:
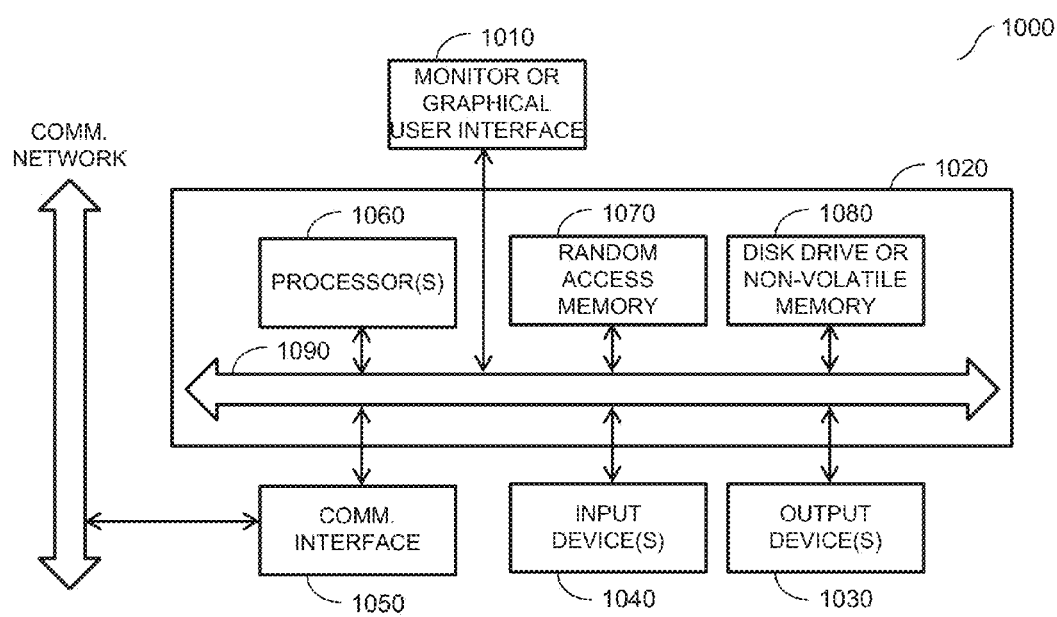
FIG. 10 depicts a block diagram of a computer system that may incorporate embodiments of the present invention.

FIG. 10 is a simplified block diagram of a computer system that may incorporate embodiments of the present invention. FIG. 10 is merely illustrative of an embodiment incorporating the present invention and does not limit the scope of the invention as recited in the claims. One of ordinary skill in the art would recognize other variations, modifications, and alternatives.

In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080.

User input devices 1030 include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1030 are typically embodied as a computer mouse, a trackball, a track pad, a joystick, wireless remote, drawing tablet, voice command system, eye tracking system, and the like. User input devices 1030 typically allow a user to select objects, icons, text and the like that appear on the monitor 1010 via a command such as a click of a button or the like.

User output devices 1040 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1020 includes one or more Xeon microprocessors from Intel as processor(s) 1060. Further, one embodiment, computer 1020 includes a UNIX-based operating system.

RAM 1070 and disk drive 1080 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only memories (ROMS), battery-backed volatile memories, networked storage devices, and the like. RAM 1070 and disk drive 1080 may be configured to store the basic programming and data constructs that provide the functionality of the present invention.

Software code modules and instructions that provide the functionality of the present invention may be stored in RAM 1070 and disk drive 1080. These software modules may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read only memory (ROM) in which fixed instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses.

FIG. 10 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. However, it will be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing flat panel displays, integrated circuits, or other electronic devices. The scope of the invention should, therefore, be determined not with reference to the above description, but instead should be determined with reference to the pending claims along with their full scope or equivalents.

What is claimed is:

1. A computer-implemented method for routing at least one conductor of an electrical device, the method comprising:
    generating, using one or more computer systems, a representation of the at least one conductor on a planar surface of a representation of the electrical device in accordance with a template;
    placing, using the one or more computer systems, at least one slit in the representation of the conductor in response to the representation of the conductor overlapping a specified region;
    calculating, using the one or more computer systems, an estimated resistance $R_e$ of the at least one conductor, wherein:

$$R_e = R_{c1} + R_{c2} * A_2/(A_2 - A_s),$$

wherein $R_{c1}$ is a resistance of a first portion of the conductor, and wherein the first portion of the conductor does not include the at least one slit, wherein $A_2$ is an area of a second portion of the conductor, and wherein the second portion of the conductor comprises the at least one slit, wherein $R_{c2}$ is a resistance of $A_2$ calculated as if $A_2$ did not have the at least one slit, and wherein $A_s$ is an area of the at least one slit; and adjusting, using the one or more computer systems, a width of the representation of the conductor based on the estimated resistance so as to meet a design constraint for the electrical device specified in the template.

2. The computer-implemented method of claim 1, wherein placing the at least one slit includes aligning, using the one or more computer systems, a longitudinal axis of the at least one slit in a direction substantially parallel to a centerline of the representation of the at least one conductor.

3. The computer-implemented method of claim 1, wherein the specified region is associated with a seal region of a flat panel display.

4. The computer-implemented method of claim 1 further comprising adapting, using the one or more computer systems, the at least one slit to allow a quantity of light to go through the at least one slit when curing an adhesive in the specified region using the quantity of light.

5. The computer-implemented method of claim 1, further comprising determining at least one of a width and a length of the at least one slit based on a characteristic of the specified region.

6. The computer-implemented method of claim 1, wherein the at least one slit includes a first slit, the method further comprising:
   placing, using the one or more computer systems, a second slit in the representation of the conductor in response to the representation of the conductor overlapping the specified region of the bounded region; and
   determining, using the one or more computer systems, at least one of a spacing between the first and second slits and an alignment between the first and second splits, wherein the at least one of the spacing and the alignment is determined based on a characteristic of the specified region.

7. The computer-implemented method of claim 1, wherein the template includes:
   a plurality of bounded region values specifying a shape of the bounded region bounded by a plurality of terminal edges and at least one boundary edge; and
   a plurality of routing constraint values specifying constraints on routing the representation of the at least one conductor through the bounded region, wherein the representation of the at least one conductor is routed between the plurality of terminal edges.

8. The computer-implemented method of claim 1, wherein calculating the estimated resistance includes using an electromagnetic field solver.

9. The computer-implemented method of claim 1, wherein calculating the estimated resistance comprises:
   dividing, using the one or more computer systems, the representation of the at least one conductor into a first section and a second section different from the first section, the second section including at least a greater portion of the at least one slit;
   calculating, using the one or more computer systems, a first resistance of the first section and a second resistance of the second section, the first and second resistances being calculated without an effect on the first and second resistances by the at least one slit;
   calculating, using the one or more computer systems, a first area of the second section by including in the first area an area occupied by the greater portion of the at least one slit;
   calculating, using the one or more computer systems, a second area of the greater portion of the at least one slit;
   calculating, using the one or more computer systems, a third resistance of the second section by multiplying the second resistance by a ratio of the first area divided by the difference of the first area minus the second area; and
   determining, using the one or more computer systems, the estimated resistance of the representation of the at least one conductor by adding the first resistance to the third resistance.

10. The computer-implemented method of claim 1, wherein dividing the representation of the at least one conductor includes cutting, using the one or more computer systems, the representation of the at least one conductor such that the second section includes the at least one slit.

11. The computer-implemented method of claim 1, wherein calculating a first or second resistance includes using a shortest path method.

12. The computer-implemented method of claim 1, wherein generating, placing, and calculating an estimated resistance are repeated until satisfying a resistance constraint for the representation of the at least one conductor specified in the template.

13. A system for routing at least one conductor of an electrical device, the method comprising:
   a processor; and
   a memory storing a set of instructions which when executed by the processor configures the processor to:
      generate a representation of the at least one conductor within a bounded region on a planar surface of a representation of the electrical device in accordance with a template;
      place at least one slit in the representation of the conductor as a result of the representation of the conductor overlapping a specified region in the bounded region;
      calculate, using the one or more computer systems, an estimated resistance $R_e$ of the at least one conductor, wherein:

$$R_e = R_{c1} + R_{c2} * A_2 / (A_2 - A_s),$$

wherein $R_{c1}$ is a resistance of a first portion of the conductor, and wherein the first portion of the conductor does not include the at least one slit,
   wherein $A_2$ is an area of a second portion of the conductor, and wherein the second portion of the conductor comprises the at least one slit,
   wherein $R_{c2}$ is a resistance of $A_2$ calculated as if $A_2$ did not have the at least one slit, and
   wherein $A_s$ is an area of the at least one slit; and
   adjust, using the one or more computer systems, a width of the representation of the conductor based on the estimated resistance so as to meet a design constraint for the electrical device specified in the template.

14. The system of claim 13, wherein the set of instructions that configures the processor to place the at least one slit includes instructions that configures the processor to align a longitudinal axis of the at least one slit in a direction substantially parallel to a centerline of the representation of the at least one conductor.

15. The system of claim 13, wherein the specified region is associated with a seal region of a flat panel display.

16. The system of claim 13, wherein the set of instructions further configures the processor to adapt the at least one slit to allow a quantity of light to go through the at least one slit when curing an adhesive in the specified region using the quantity of light.

17. The system of claim 13, wherein at least one of a width and a length is determined based on a characteristic of the specified region.

18. The system of claim 13, wherein the at least one slit includes a first slit, wherein the set of instructions further configures the processor:
to place a second slit in the representation of the conductor as a result of the representation of the conductor overlapping the specified region; and
to determine at least one of a spacing between the first and second slits and an alignment between the first and second splits, wherein the at least one of the spacing and the alignment is determined based on a characteristic of the specified region.

19. The system of claim 13, wherein the template includes:
a plurality of bounded region values specifying a shape of the bounded region bounded by a plurality of terminal edges and at least one boundary edge; and
a plurality of routing constraint values specifying constraints on routing the representation of the at least one conductor through the bounded region, wherein the representation of the at least one conductor is routed between the plurality of terminal edges.

20. The system of claim 13, wherein the set of instructions further configures the processor to calculate the estimated resistance by using an electromagnetic field solver.

21. The system of claim 13, wherein the set of instructions further configures the processor to:
divide the representation of the at least one conductor into a first section and a second section different from the first section, the second section including at least a greater portion of the at least one slit;
calculate a first resistance of the first section and a second resistance of the second section, the first and second resistances being calculated without an effect on the first and second resistances by the at least one slit;
calculate a first area of the second section by including in the first area an area occupied by the greater portion of the at least one slit;
calculate a second area of the greater portion of the at least one slit;
calculate a third resistance of the second section by multiplying the second resistance by a ratio of the first area divided by the difference of the first area minus the second area; and
determine the estimated resistance of the representation of the at least one conductor by adding the first resistance to the third resistance.

22. The system of claim 13, wherein the set of instructions further configures the processor to divide the representation of the at least one conductor such that the second section includes the at least one slit.

23. The system of claim 13, wherein the set of instructions further configures the processor to calculate a first or second resistance using a shortest path method.

24. The system of claim 13, wherein the set of instructions further configures the processor to generate, place, and calculate an estimated resistance repeatedly until satisfying a resistance constraint for the representation of the at least one conductor specified in the template.

25. A non-transitory computer-readable medium storing computer-executable code for routing at least one conductor of an electrical device, the medium comprising:
code for generating a representation of the at least one conductor within a bounded region on a planar surface of a representation of the electrical device in accordance with a template;
code for placing at least one slit in the representation of the conductor as a result of the representation of the conductor overlapping a specified region in the bounded region;
code for calculating an estimated resistance $R_e$ of the at least one conductor, wherein:

$$R_e = R_{c1} + R_{c2} * A_2/(A_2 - A_s),$$

wherein $R_{c1}$ is a resistance of a first portion of the conductor, and wherein the first portion of the conductor does not include the at least one slit,
wherein $A_2$ is an area of a second portion of the conductor, and wherein the second portion of the conductor comprises the at least one slit,
wherein $R_{c2}$ is a resistance of $A_2$ calculated as if $A_2$ did not have the at least one slit, and
wherein $A_s$ is an area of the at least one slit; and
code for adjusting a width of the representation of the conductor based on the estimated resistance so as to meet a design constraint for the electrical device specified in the template.

26. The non-transitory computer-readable medium of claim 25, wherein code for placing the at least one slit includes code for aligning a longitudinal axis of the at least one slit in a direction substantially parallel to a centerline of the representation of the at least one conductor.

27. The non-transitory computer-readable medium of claim 25, wherein the specified region is associated with a seal region of a flat panel display.

28. The non-transitory computer-readable medium of claim 25 further comprising code for adapting the at least one slit to allow a quantity of light to go through the at least one slit when curing an adhesive in the specified region using the quantity of light.

29. The non-transitory computer-readable medium of claim 25, wherein at least one of a width and a length is determined based on a characteristic of the specified region.

30. The non-transitory computer-readable medium of claim 25, wherein the at least one slit includes a first slit, the non-transitory computer-readable medium further comprising code for:
placing a second slit in the representation of the conductor as a result of the representation of the conductor overlapping the specified region; and
determining at least one of a spacing between the first and second slits and an alignment between the first and second splits, wherein the at least one of the spacing and the alignment is determined based on a characteristic of the specified region.

31. The non-transitory computer-readable medium of claim 25, wherein the template includes:
a plurality of bounded region values specifying a shape of the bounded region bounded by a plurality of terminal edges and at least one boundary edge; and
a plurality of routing constraint values specifying constraints on routing the representation of the at least one conductor through the bounded region, wherein the representation of the at least one conductor is routed between the plurality of terminal edges.

32. The non-transitory computer-readable medium of claim 25, wherein code for calculating the estimated resistance includes code for using an electromagnetic field solver.

33. The non-transitory computer-readable medium of claim 25, wherein code for calculating the estimated resistance comprises:
   code for dividing the representation of the at least one conductor into a first section and a second section different from the first section, the second section including at least a greater portion of the at least one slit;
   code for calculating a first resistance of the first section and a second resistance of the second section, the first and second resistances being calculated without an effect on the first and second resistances by the at least one slit;
   code for calculating a first area of the second section by including in the first area an area occupied by the greater portion of the at least one slit;
   code for calculating a second area of the greater portion of the at least one slit;
   code for calculating a third resistance of the second section by multiplying the second resistance by a ratio of the first area divided by the difference of the first area minus the second area; and
   code for determining the estimated resistance of the representation of the at least one conductor by adding the first resistance to the third resistance.

34. The non-transitory computer-readable medium of claim 25, wherein code for generating, code for placing, and code for calculating an estimated resistance are repeated until satisfying a resistance constraint for the representation of the at least one conductor specified in the template.

35. The non-transitory computer-readable medium of claim 25, wherein code for dividing the representation of the at least one conductor includes code for cutting the representation of the at least one conductor such that the second section includes the at least one slit.

36. The non-transitory computer-readable medium of claim 25, wherein code for calculating a first or second resistance includes code for using a shortest path method.

37. A computer-implemented method for routing at least one conductor of an electrical device, the method comprising:
   generating, using one or more computer systems, a representation of the at least one conductor on a planar surface of a representation the electrical device in accordance with a template;
   placing, using the one or more computer systems, at least one slit in the representation of the conductor as a result of the representation of the conductor overlapping a specified region;
   calculating, using the one or more computer systems, an estimated resistance based on an area ratio technique; and
   adjusting a width of the representation of the conductor based on the estimated resistance so as to meet a design constraint for the electrical device specified in the template.

38. The computer-implemented method of claim 37, wherein the specified region is associated with a seal region of a flat panel display.

39. The computer-implemented method of claim 37, further comprising adapting, using the one or more computer systems, the at least one slit to allow a quantity of light to go through the at least one slit when curing an adhesive in the specified region using the quantity of light.

40. The computer-implemented method of claim 37, wherein the template includes:
   a plurality of bounded region values specifying a shape of the bounded region bounded by a plurality of terminal edges and at least one boundary edge; and
   a plurality of routing constraint values specifying constraints on routing the representation of the at least one conductor through the bounded region, wherein the representation of the at least one conductor is routed between the plurality of terminal edges.

41. The computer-implemented method of claim 37, wherein calculating the estimated resistance comprises:
   dividing, using the one or more computer systems, the representation of the at least one conductor into a first section and a second section different from the first section, the second section including at least a greater portion of the at least one slit;
   calculating, using the one or more computer systems, a first resistance of the first section and a second resistance of the second section, the first and second resistances being calculated without an effect on the first and second resistances by the at least one slit;
   calculating, using the one or more computer systems, a first area of the second section by including in the first area an area occupied by the greater portion of the at least one slit;
   calculating, using the one or more computer systems, a second area of the greater portion of the at least one slit;
   calculating, using the one or more computer systems, a third resistance of the second section by multiplying the second resistance by a ratio of the first area divided by the difference of the first area minus the second area; and
   determining, using the one or more computer systems, the estimated resistance of the representation of the at least one conductor by adding the first resistance to the third resistance.

42. The computer-implemented method of claim 37, wherein generating, placing, and calculating an estimated resistance are repeated until satisfying a resistance constraint for the representation of the at least one conductor specified in the template.

43. A computer-implemented method for routing at least one conductor of an electrical device, the method comprising:
   generating, using one or more computer systems, a representation of the at least one conductor on a planar surface of a representation the electrical device in accordance with a template;
   placing, using the one or more computer systems, at least one slit in the representation of the conductor as a result of the representation of the conductor overlapping a specified region;
   calculating, using the one or more computer systems, an estimated resistance based on a ratio of first and second areas of first and second surfaces, respectively, wherein each of the first and second surfaces is substantially parallel with a direction of expected current flow through the conductor, and wherein:
   the first surface is defined by the at least one slit, and
   the second surface is defined by a portion of the representation of the conductor and the at least one slit; and
   adjusting a width of the representation of the conductor based on the estimated resistance so as to meet a design constraint for the electrical device specified in the template.

44. The computer-implemented method of claim 43, wherein the specified region is associated with a seal region of a flat panel display.

45. The computer-implemented method of claim 43, further comprising adapting, using the one or more computer systems, the at least one slit to allow a quantity of light to go through the at least one slit when curing an adhesive in the specified region using the quantity of light.

46. The computer-implemented method of claim 43, wherein the template includes:
- a plurality of bounded region values specifying a shape of the bounded region bounded by a plurality of terminal edges and at least one boundary edge; and
- a plurality of routing constraint values specifying constraints on routing the representation of the at least one conductor through the bounded region, wherein the representation of the at least one conductor is routed between the plurality of terminal edges.

47. The computer-implemented method of claim 43, wherein calculating the estimated resistance comprises:
- dividing, using the one or more computer systems, the representation of the at least one conductor into a first section and a second section different from the first section, the second section including at least a greater portion of the at least one slit;
- calculating, using the one or more computer systems, a first resistance of the first section and a second resistance of the second section, the first and second resistances being calculated without an effect on the first and second resistances by the at least one slit;
- calculating, using the one or more computer systems, a first area of the second section by including in the first area an area occupied by the greater portion of the at least one slit;
- calculating, using the one or more computer systems, a second area of the greater portion of the at least one slit;
- calculating, using the one or more computer systems, a third resistance of the second section by multiplying the second resistance by a ratio of the first area divided by the difference of the first area minus the second area; and
- determining, using the one or more computer systems, the estimated resistance of the representation of the at least one conductor by adding the first resistance to the third resistance.

48. The computer-implemented method of claim 43, wherein generating, placing, and calculating an estimated resistance are repeated until satisfying a resistance constraint for the representation of the at least one conductor specified in the template.

* * * * *